US011166361B2

United States Patent
Chen et al.

(10) Patent No.: US 11,166,361 B2
(45) Date of Patent: Nov. 2, 2021

(54) METHOD AND DEVICE FOR MEASURING CONTAMINATION IN EUV SOURCE

(71) Applicant: TAIWAN SEMICONDUCTOR MANUFACTURING CO., LTD., Hsinchu (TW)

(72) Inventors: Kuan-Hung Chen, Taoyuan (TW); Shang-Chieh Chien, New Taipei (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/697,149

(22) Filed: Nov. 26, 2019

(65) Prior Publication Data
US 2020/0178380 A1     Jun. 4, 2020

Related U.S. Application Data

(60) Provisional application No. 62/774,140, filed on Nov. 30, 2018.

(51) Int. Cl.
*H05G 2/00*     (2006.01)
*G03F 7/20*     (2006.01)

(52) U.S. Cl.
CPC ......... *H05G 2/008* (2013.01); *G03F 7/70033* (2013.01); *G03F 7/70558* (2013.01)

(58) Field of Classification Search
CPC . H05G 2/008; G03F 7/70033; G03F 7/70558; G03F 7/70908; G03F 7/70916; G03F 7/7085
See application file for complete search history.

(56) References Cited

U.S. PATENT DOCUMENTS

| | | | |
|---|---|---|---|
| 8,796,666 | B1 | 8/2014 | Huang et al. |
| 9,093,530 | B2 | 7/2015 | Huang et al. |
| 9,134,633 | B2 | 9/2015 | Lin et al. |
| 9,230,867 | B2 | 1/2016 | Cheng et al. |
| 9,304,403 | B2 | 4/2016 | Lin et al. |
| 9,404,743 | B2 | 8/2016 | Chiu et al. |
| 9,548,303 | B2 | 1/2017 | Lee et al. |

(Continued)

OTHER PUBLICATIONS

J. Sporre, R. Raju, D. N. Ruzic, V. Surla, F. Goodwin, "Measurement of particle flux at the intermediate focus of a DPP source," Proc. SPIE 7271, Alternative Lithographic Technologies, 727137 (Mar. 18, 2009); https://doi.org/10.1117/12.814225 (Year: 2009).*

(Continued)

*Primary Examiner* — Steven Whitesell Gordon
(74) *Attorney, Agent, or Firm* — McDermott Will & Emery LLP

(57) ABSTRACT

A lithography apparatus includes an extreme ultraviolet (EUV) scanner, an EUV source coupled to the EUV scanner, a quartz crystal microbalance and a feedback controller. The quartz crystal microbalance is disposed on an internal surface of at least one of the EUV source and the EUV scanner. The feedback controller is coupled to the quartz crystal microbalance and one or more of a radiation source, a droplet generator, and optical guide elements controlling the trajectory of the radiation source associated with the EUV source.

20 Claims, 11 Drawing Sheets

(56) References Cited

U.S. PATENT DOCUMENTS

| | | | |
|---|---|---|---|
| 9,823,585 B2 | 11/2017 | Shih et al. | |
| 9,841,687 B2 | 12/2017 | Lee et al. | |
| 9,859,139 B2 | 1/2018 | Cheng et al. | |
| 2008/0087840 A1* | 4/2008 | Ueno | H05G 2/001 250/396 ML |
| 2010/0171049 A1* | 7/2010 | Moriya | H05G 2/008 250/504 R |
| 2012/0080584 A1* | 4/2012 | Partlo | H05G 2/008 250/214.1 |
| 2016/0209753 A1* | 7/2016 | Zhao | G03F 7/70916 |

OTHER PUBLICATIONS

J. Sporre, V. Surla, M. J. Neumann, D. N. Ruzic, L. Ren, F. Goodwin, "Debris measurement at the intermediate focus of a laser-assisted dischargeproduced plasma light source," Proc. SPIE 7636, Extreme Ultraviolet (EUV) Lithography, 763611 (Mar. 20, 2010); doi: 10.1117/12.846590 (Year: 2010).*

D. J. W. Klunder, M. M. J. W. van Herpen, V. Y. Banine, K. Gielissen, "Debris mitigation and cleaning strategies for Sn-based sources for EUV lithography," Proc. SPIE 5751, Emerging Lithographic Technologies IX, (May 6, 2005); doi:10.1117/12.619568 (Year: 2005).*

* cited by examiner

FIG. 2B
FIG. 2C
FIG. 2D
FIG. 2E

METHOD AND DEVICE FOR MEASURING CONTAMINATION IN EUV SOURCE

RELATED APPLICATIONS

This application claims the priority of U.S. Provisional Application No. 62/774,140 filed on Nov. 30, 2018, the entire contents of which application are incorporated herein by reference.

BACKGROUND

The demand for computational power has increased exponentially. This increase in computational power is met by increasing the functional density, i.e., number of interconnected devices per chip, of semiconductor integrated circuits (ICs). With the increase in functional density, the size of individual devices on the chip has decreased. The decrease in size of components in ICs has been met with advancements in semiconductor manufacturing techniques such as lithography.

For example, the wavelength of radiation used for lithography has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm.

One method for producing EUV radiation is laser-produced plasma (LPP). In an LPP based EUV source a high-power laser beam is focused on small tin droplet targets to form highly ionized plasma that emits EUV radiation with a peak maximum emission at 13.5 nm. The intensity of the EUV radiation produced by LPP depends on the effectiveness with which the high-powered laser can produce the plasma from the droplet targets. Synchronizing the pulses of the high-powered laser with generation and movement of the droplet targets can improve the efficiency of an LPP based EUV radiation source.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E, and 2F schematically illustrate the movement of target droplet by the pre-pulse in X-Z and X-Y planes respectively.

DETAILED DESCRIPTION

Figure 1:
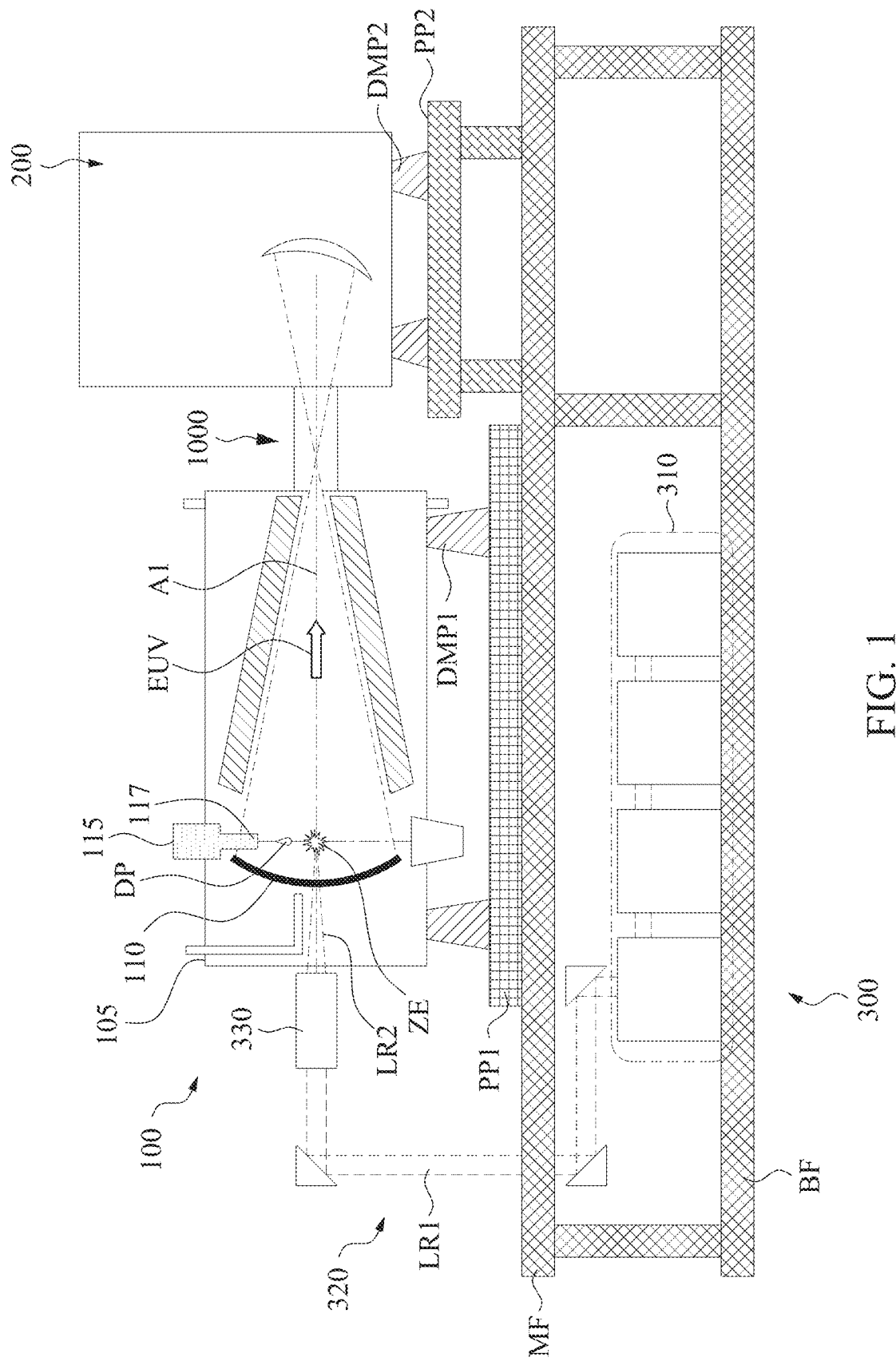
FIG. 1 is a schematic view of an EUV lithography system with a laser produced plasma (LPP) EUV radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography system and methods. More particularly, it is related to apparatus and methods for controlling an excitation laser used in a laser produced plasma (LPP)-based EUV radiation source and the EUV lithography scanner tool. If more than a pre-defined amount of a debris or contaminants (refer as "debris" hereinafter) pass from the source chamber to the scanner tool, the optical elements of the scanner would suffer irreparable damage due to the debris. The yield of the lithography process will reduce and/or the cost of lithography would substantially increase because of the downtime to replace damaged optical components. One of the objectives of the present disclosure is directed to monitoring and controlling the debris passing from the LPP-based EUV source to an EUV scanner to provide proactive measures for preventing and/or mitigating damage to the optical components in the EUV scanner. The general configuration, operation and/or functions of an EUV lithography system are described in US Publication No. 2016/0320708 and US Publication No.

2016/0212803, the entire contents of both of which are incorporated herein by reference.

FIG. 1 is a schematic view of an EUV lithography system with a LPP-based EUV radiation source, in accordance with some embodiments of the present disclosure. The EUV lithography system includes an EUV radiation source 100 to generate EUV radiation, an exposure tool 200, such as a scanner, and an excitation laser source 300. As shown in FIG. 1, in some embodiments, the EUV radiation source 100 and the exposure tool 200 are installed on a main floor MF of a clean room, while the excitation laser source 300 is installed in a base floor BF located under the main floor. Each of the EUV radiation source 100 and the exposure tool 200 are placed over pedestal plates PP1 and PP2 via dampers DMP1 and DMP2, respectively. The EUV radiation source 100 and the exposure tool 200 are coupled to each other by a coupling mechanism, which may include a focusing unit.

The lithography system is an extreme ultraviolet (EUV) lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optical components, such as convex/concave/flat mirrors, a mask holding mechanism including a mask stage, and wafer holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. In an embodiment, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a LPP collector 110, enclosed by a chamber 105. The target droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm, in an embodiment. The laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as "pre-pulse") is used to heat (or pre-heat) a given target droplet to create a low-density target plume with multiple smaller droplets, which is subsequently heated (or reheated) by a pulse from the main laser, generating increased emission of EUV.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplet DP in an embodiment.

The laser light LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure tool 200.

Figure 2A:
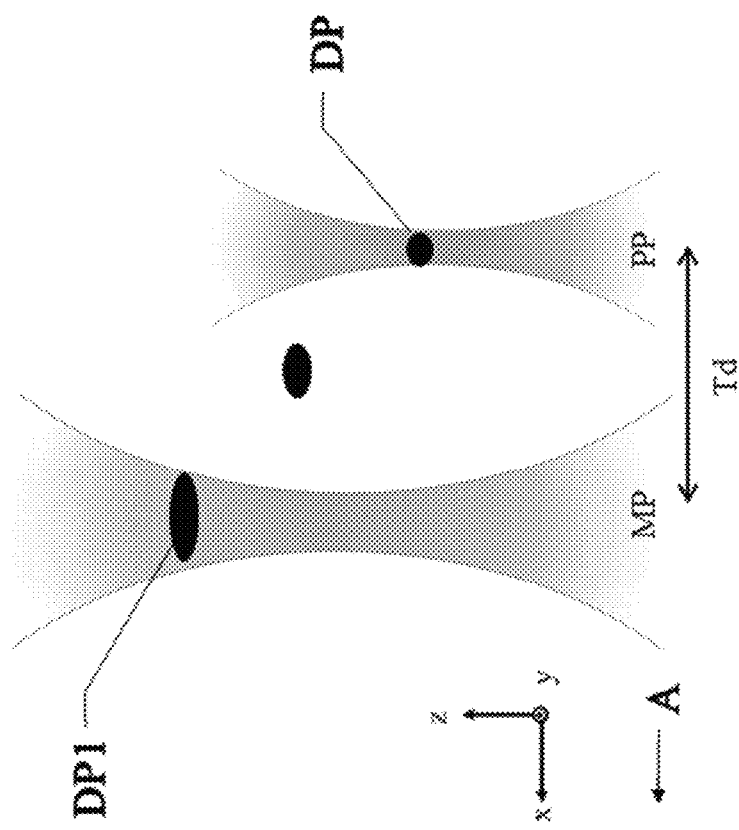

FIG. 2A illustrates the trajectory of the target droplet between the pre-pulse PP and the main pulse MP. As shown in FIG. 2A, a target droplet DP is sequentially irradiated by the pre-pulse PP and the main pulse MP. When the target droplets DP travels along the x-axis in a direction "A" from right to left of FIG. 2A, the target droplet DP is exposed to the pre-pulse PP and the pre-pulse PP heats the target droplet DP causing the target droplet DP to expand, gasify, vaporize, and ionize, and a weak plasma is generated. The following main pulse MP generates a strong plasma and converts the target droplet DP material into a plasma that produces an EUV light emission. There is a time delay Td between the pre-pulse PP and the main-pulse MP. In some embodiments, the time delay Td is in the range from 2500 ns to 3500 ns. In some embodiments, a pre-pulse PP incident upon the target droplet DP has an elliptical cross sectional shape. The elliptical shape of the pre-pulse PP provides an unequal distribution of laser radiation across the surface of the target droplet DP. This unequal distribution provides an unequal temperature and pressure distribution across the target droplet DP which in turn causes the target droplets DP to expand in a non-circular-symmetric manner. As a result of this expansion, the target droplets DP expand to form a generally elliptically shaped target droplet DP1, as shown in FIG. 2A.

The position of the zone of excitation ZE and parameters such as, for example, laser power, time delay between the main pulse and the pre-pulse, focal point of the pre-pulse and/or main pulse, may be determined when the EUV radiation source 100 is set up. The actual position of the zone of excitation ZE and afore-mentioned parameters are then adjusted during wafer exposure using a feedback control system in various embodiments. However, these parameters can change over time due to various factors such as, for example, mechanical and/or electrical drift in the radiation source, instability of the droplet generator, and changes in chamber environment.

FIG. 2B illustrates an exemplary optical metrology for misalignment in the x-axis OMX. The OMX is defined by a distance in the x-axis between a droplet and the focal point of the pre-pulse PP. Similarly, FIG. 2C illustrates an exemplary optical metrology for misalignment in the y-axis OMY. The OMY is also defined by a distance in the y-axis between the droplet and the focal point of the pre-pulse PP. In some embodiments, the optical metrology for misalignment in Y axis OMY is in a range of −20 μm to 35 μm. FIG. 2D further illustrates an exemplary optical metrology for misalignment in the z-axis OMZ. Similar to OMX and OMY, the OMZ is defined by a distance in the z-axis between a droplet and the focal point of the pre-pulse PP. FIG. 2E illustrates an exemplary optical metrology for misalignment in radius OMR. The x-axis is in the direction of motion by the droplet from the droplet generator 115. The z-axis is along the optical axis A1 of the collector mirror 110. The y-axis is perpendicular to the x-axis and the z-axis.

Figure 2F:
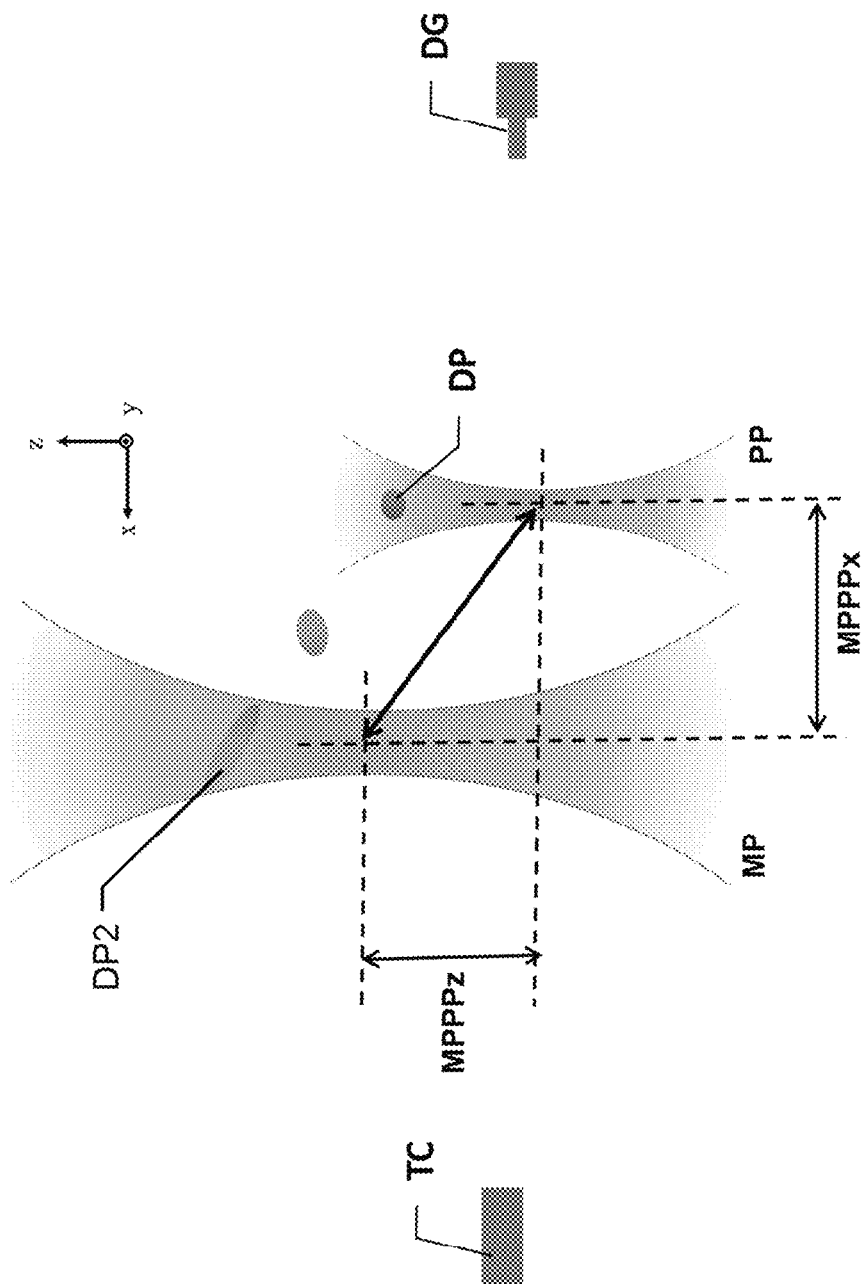

As shown in FIG. 2F, the target droplet DP is ejected from a droplet generator travelling in a direction to a tin catcher TC. When such mechanical and/or electrical drift occurs in the radiation source, the pre-pulse laser PP causes the target droplet DP to expand in a direction with an angle with respect to a direction of incidence from the pre-pulse laser beam. This gives a rise to a target droplet DP2 which has expanded to form a football-like shape shown in FIG. 2F. In such an embodiment, a spatial separation between the pre-pulse PP and the main-pulse MP, MPPP separation, is defined as a distance between the focal point of the pre-pulse PP and the focal point of the main-pulse MP, which is a 3-D vector contributed by x, y, and z sections. For example, as shown in FIG. 2F, MPPPx is a distance along the x-axis of the MPPP separation and MPPPz is a distance along the z-axis of the MPPP separation.

Figure 3B:
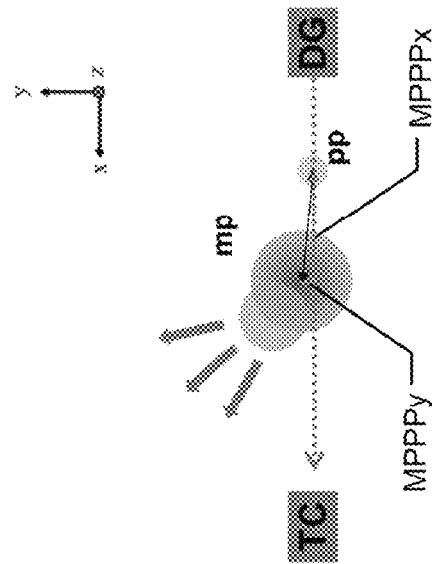
FIGS. 3A and 3B schematically illustrate the effect of variation in distance between the focal point of the pre-pulse and the focal point of the main pulse hits in X and Y directions.
Figure 3A:
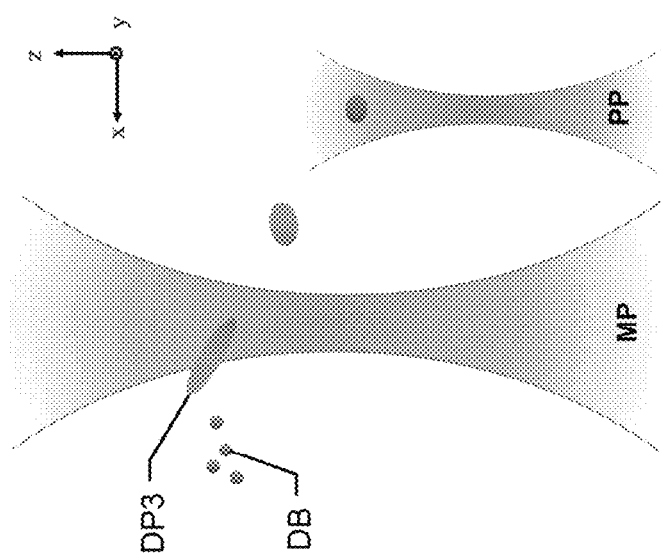

In some instances as shown in FIGS. 3A and 3B, the mechanical and/or electrical drift of the EUV radiation source changes the trajectory of the main pulse MP causing the main pulse MP to partially miss the target droplet DP3. As a consequence, some of the under heated tin droplets may be converted to plasma and others may be scattered around the chamber as the debris DB as shown in FIG. 3B. The debris DB contaminates various surfaces in the chamber including the collector mirror. Moreover, because the amount of plasma is reduced due to the optical misalignment, the EUV energy generated by the misaligned pulse is also reduced, resulting in a dose error during the lithography exposure.

Figure 4A:
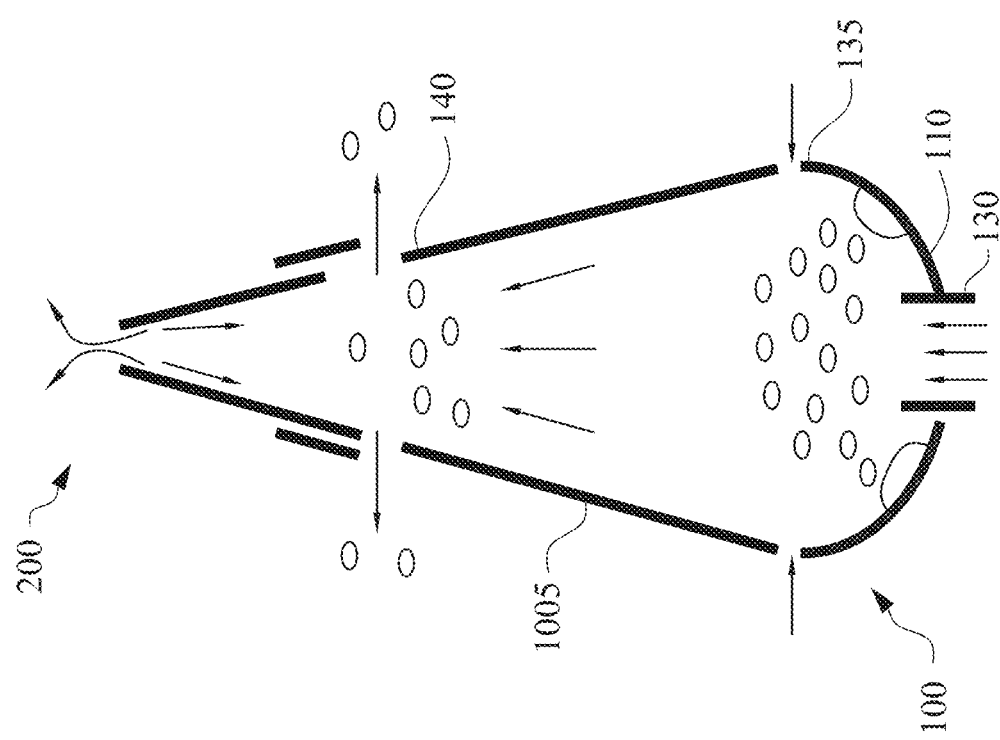
FIG. 4A schematically illustrates an exhaust flow in an EUV vessel according to some embodiments of the present disclosure.

FIG. 4A schematically illustrates an exhaust flow in an EUV vessel 1005 for the EUV radiation source 100. As shown in FIG. 4A, in some embodiments, a buffer gas is supplied from a first buffer gas supply 130 through the aperture in the collector 110 by which the pulse laser is delivered to the tin droplets. In some embodiments, the buffer gas is $H_2$, He, Ar, N or another inert gas. In certain embodiments, $H_2$ is used because H radicals generated by ionization of the buffer gas can be used for cleaning purposes. The buffer gas can also be provided through one or more second buffer gas supplies 135 toward the collector 110 and/or around the edges of the collector 110. Further, the EUV vessel 1005 includes one or more gas outlets 140 so that the buffer gas is exhausted outside the EUV vessel 1005.

Hydrogen gas has low absorption to the EUV radiation. Hydrogen gas reaching to the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200.

Moreover, if $SnH_4$ or other contaminant debris enter the exposure tool 200 is more than a threshold amount or concentration, the optical components in the exposure tool 200 may suffer irreparable damage, and may need to be scrapped. Thus, apparatuses and methods for real-time measurement of the amount of contamination passing from the EUV radiation source 100 to the exposure tool 200 are desired. Furthermore, methods and apparatuses for adjusting the parameters of the EUV generation process to prevent and/or mitigate any excessive contamination are desired.

Figure 4B:
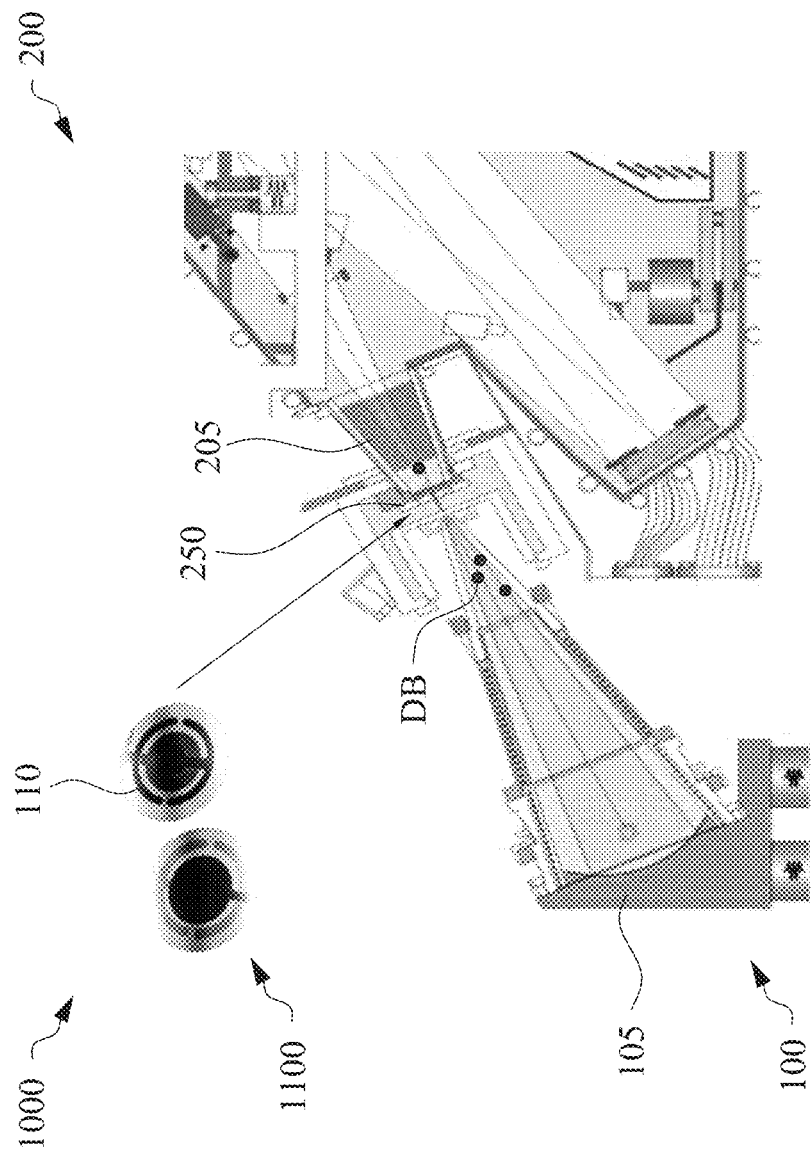
FIG. 4B schematically illustrates an apparatus for measuring the debris passing from the EUV radiation source to the exposure tool.

FIG. 4B schematically illustrates an apparatus 1000 for measuring the debris DB passing through an EUV scanner 205 from the EUV radiation source 100 to the exposure tool 200 in accordance with an embodiment of the present disclosure. The apparatus 1000 includes a mass detector 1100 disposed on an internal surface of at least one of the EUV radiation source 100 and the EUV scanner 205. In some embodiments, the mass detector 1100 is positioned at or adjacent to an interface between the EUV radiation source 100 and the EUV scanner 205. In some embodiments, the mass detector 1100 is positioned at or adjacent to a scanner gate port 250. In some embodiments, the mass detector 1100 is positioned on an internal surface of the chamber 105 or the exposure tool 200. Without wishing to be bound by theory, if the transfer rate of contaminant particles, debris and/or Sn contaminant, from the EUV radiation source 100 to the exposure tool 200 increases, the rate of deposition on the mass detector 1100 located or adjacent the interface increases. Thus, by monitoring the rate of deposition on the mass detector 1100, the rate of transfer of the contaminant particles from the EUV radiation source 100 to the exposure tool 200 can be monitored.

In some embodiments, the mass detector 1100 is a quartz crystal microbalance (QCM) sensor 1110. The quartz crystal microbalance sensor 1110 measures the debris mass per unit area by measuring the change in frequency of a quartz crystal resonator in response to the addition or removal of deposited particle mass at the surface of the acoustic resonator. The quartz crystal microbalance sensor 1110 outputs a signal representing the rate of change in deposited particle mass. In some embodiments, the mass detector 1100 outputs the signal directly from the quartz resonator, and the calculation for the rate of change in deposited particle mass is performed externally (e.g., by a controller). In other embodiments, the mass detector 1100 includes a special purpose processor or hardware for performing the calculation, and outputs a digital or analog signal proportional to the rate of change in deposited particle mass.

Figure 5A:
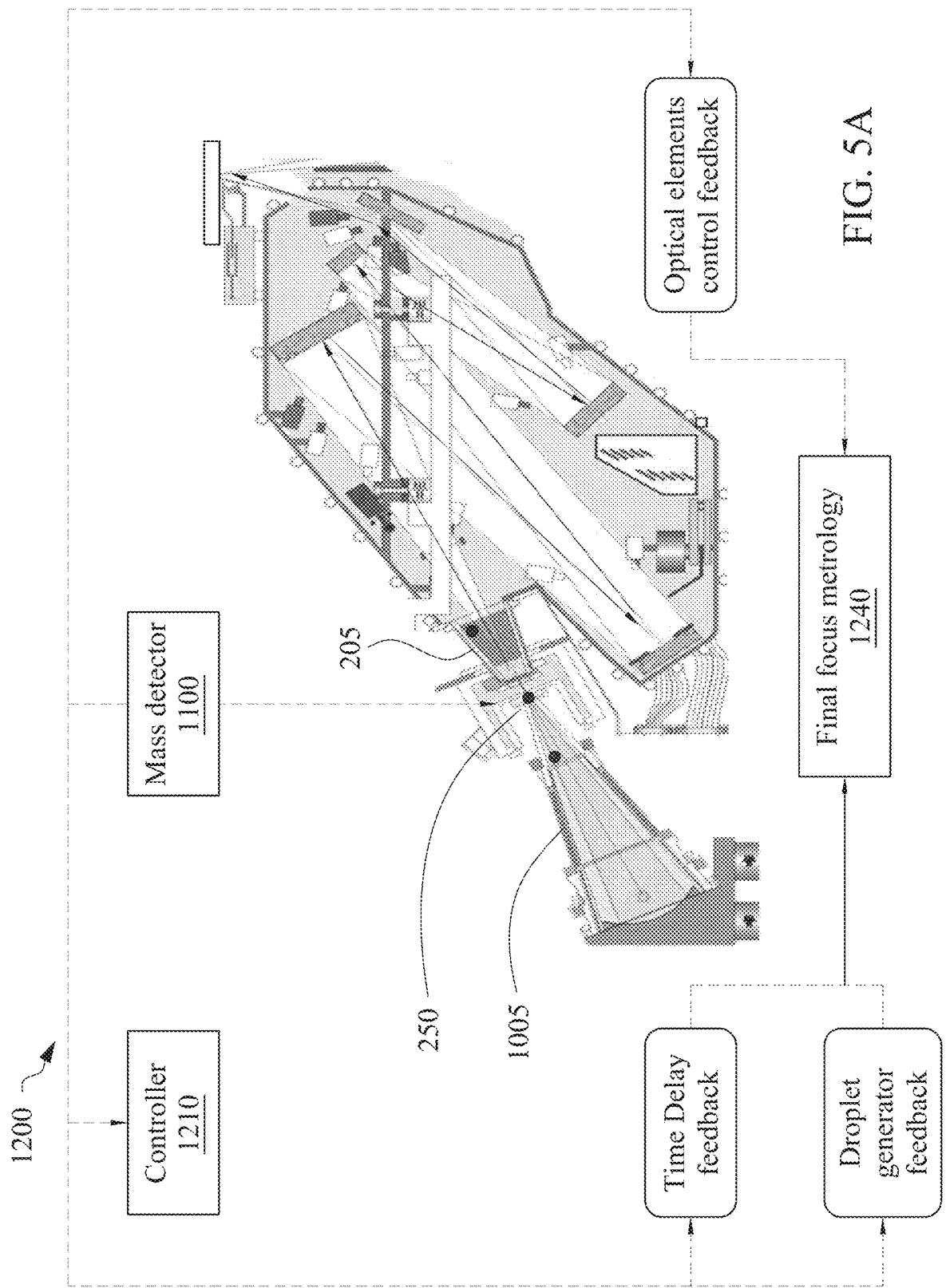
FIG. 5A shows a schematic of a feedback control system for controlling debris particles according to some embodiments of the present disclosure.

As shown in FIG. 5A, in some embodiments, a feedback control system 1200 is provided for controlling debris particles based on a rate of change in particle mass generated by the debris particles.

The feedback control system 1200 monitors a rate of change in deposited particle mass indicated by the measurements from the mass detector 1100. In some embodiments, the particle mass measurement is performed by the mass detector 1100 located adjacent to the interface between the EUV radiation source 100 and an EUV scanner 205. In some embodiments, the particle mass measurement is performed at or adjacent to the scanner gate port 250 to monitor the rate of change in deposited particle mass caused by the cleaning gas within the EUV vessel 1005. In some embodiments, the particle mass measurement is performed on an internal surface of the chamber 105 or the exposure tool 200. In some embodiments, the rate of change in deposited particle mass is determined by the controller 1210 based on whether the deposited particle mass measurement by the mass detector 1100 is increasing and/or decreasing. The deposited particle mass measured by the mass detector 1100 indicates the deposited particle adjacent to the interface. In some embodiments, when changes in the deposited particle mass are detected by the mass detector 1100, the controller 1210 of the feedback control system 1200 performs a determination based on a value of deposited particle mass and/or a changing rate of the deposited particle mass measured by the mass detector 1100. In some embodiments, the mass detector 1100 includes a logic circuit programmed to generate a signal when the detected variation in deposited particle mass measurement is not within an acceptable range. For example, a signal is generated when the detected variation in a deposited particle mass measurement is above a certain threshold value. The threshold value of variation in particle mass measurement is, for example, an expected minimum variation in deposited particle mass measurement. In some embodiments, the expected minimum variation in deposited particle mass measurement is determined based an average variation in particle mass measurement for a largest change. In some embodiments, the expected minimum variation in deposited particle mass measurement is, for example, one standard deviation or two standard deviations less than the average variation in deposited particle mass measurement determined for the largest change.

In some embodiments, the spatial separation between the pre-pulse PP and the main-pulse MP, MPPP separation, is adjusted by a mass detector 1100. In some embodiments, a variation in deposited particle mass measured by the mass detector 1100 is used as a feedback for adjusting a time delay between subsequent pre-pulse and main pulse. In some embodiments, a final focus metrology (FFM) module 1240 is provided at the final focus of the pre-pulse and the main-pulse. The FFM module 1240 controls a plurality of optical elements. The signal from the FFM module 1240 is used as a feedback for adjusting the time delay between subsequent pre-pulse and main pulse in some embodiments. In some embodiments, the feedback may be connected with an actuator to control one of the optical elements, such as for example, the last optical element in the optical path before the laser hits the target droplets.

The feedback control system provided in some embodiments further send a notification based on a subsequent mass measurement information indicating the mass measurement is within the acceptable mass measurement range. In some embodiments, the notification includes a spatial separation between the pre-pulse and the main-pulse. In some embodiments, the notification also includes a time delay between the pre-pulse and the main-pulse. In some embodiments, the notification also includes an angle of an adjustable optical element coupled to the radiation source. In some embodiments, based on the generating the notification, the feedback further sends the notification to a first external device associated with an adjustable optical element controller and a second external device associated with a time delay controller.

Figure 5B:
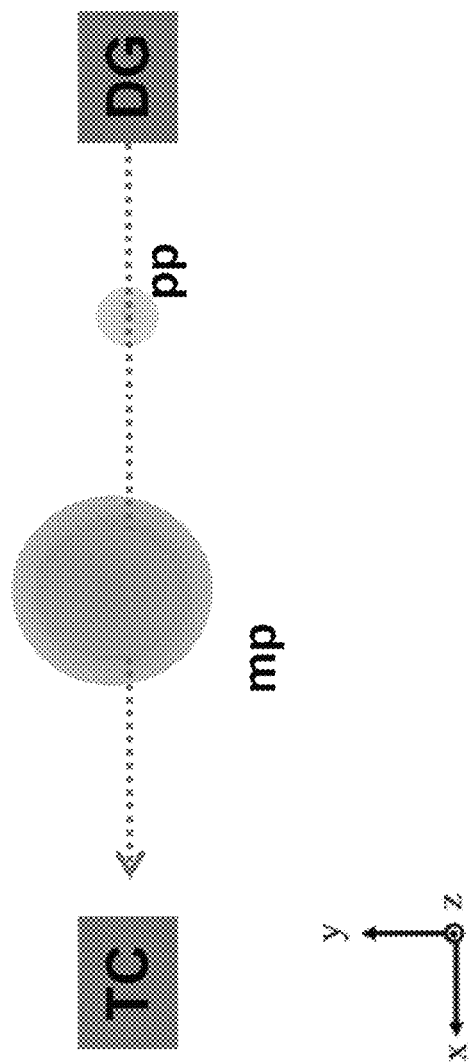
FIG. 5B schematically illustrates the effect of adjusting parameters of the EUV radiation source based on the feedback control system according to some embodiments of the present disclosure.

FIG. 5B schematically illustrates the effect of adjusting the distance between the position at which the pre-pulse hits the target droplet and the position at which the main pulse hits the target droplet. The feedback control system changes the time delay between the pre-pulse and the main pulse, thereby adjusting the points where the droplet DP is hit by the pre-pulse and the main pulse. As discussed elsewhere herein, the change in trajectory of the target droplet results in a change in EUV energy generated from the corresponding main pulse. Thus, the particle mass measurement by the mass detector can be used to adjust for the drift in focus of the pre-pulse and/or the main pulse.

Figure 6:
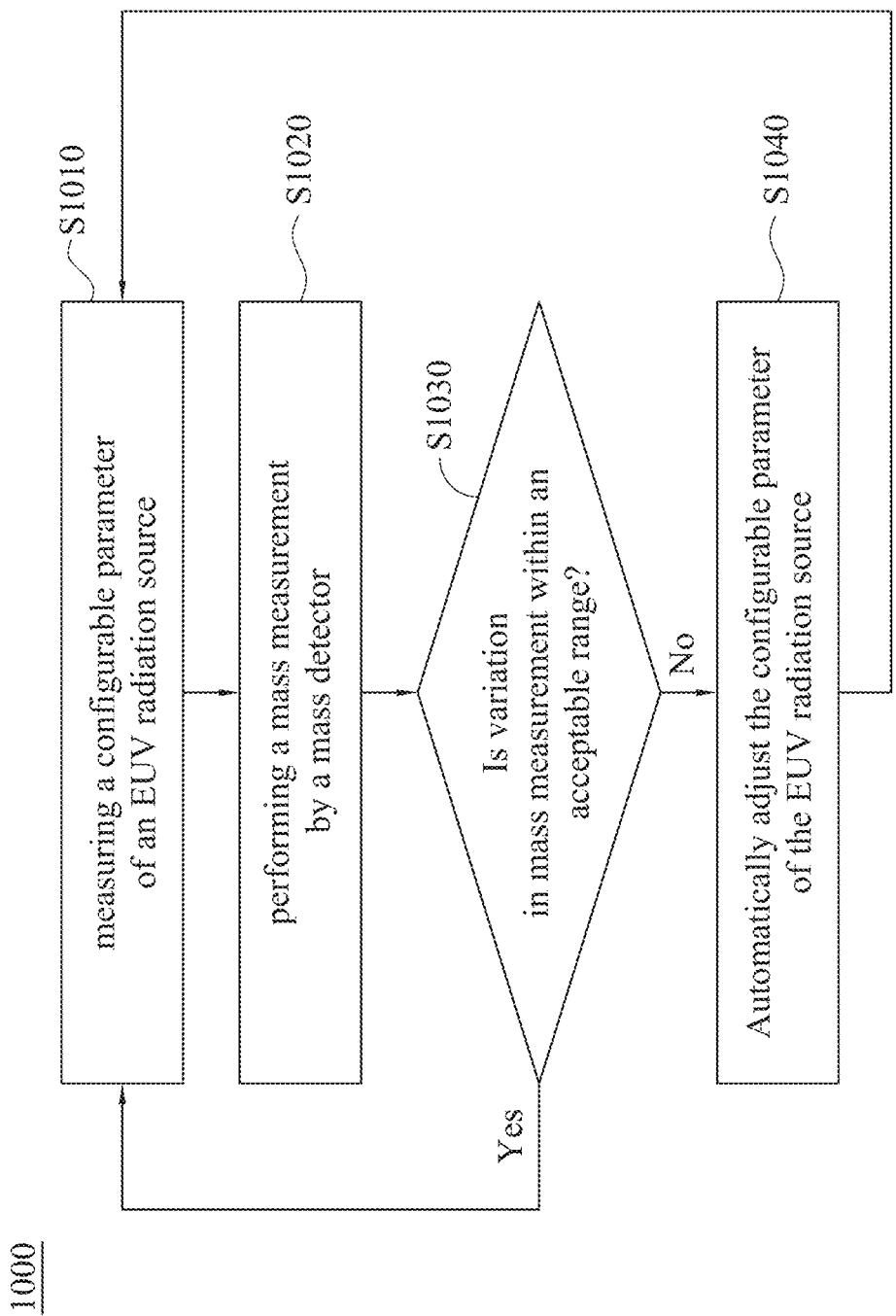
FIG. 6 illustrates a flow-chart of a method of controlling the excitation laser/mass detector system of the EUV radiation source in accordance with an embodiment of the present disclosure.

FIG. 6 illustrates a flow-chart of a method 1000 of controlling the mass detector 1100 with the feedback control system of the EUV source, in accordance with an embodiment of the present disclosure. The method includes, at S 1010, measuring a configurable parameter of the EUV apparatus. In some embodiments, the configurable parameter is the time delay between the pre-pulse and the main pulse, the MPPP time delay, At S 1020, a mass measurement is performed by the mass detector. In some embodiments, the quartz crystal microbalance sensor 1110 measures the debris mass per unit area by measuring the change in frequency of a quartz crystal resonator in response to the addition or removal of deposited particle mass at the surface of the acoustic resonator.

At S 1030, it is determined whether a variation in mass measurement of the deposited particle mass is within an acceptable range. In some embodiments, the mass detector includes a logic circuit programmed to generate a predetermined signal when the detected variation in mass measurement is not within an acceptable range. For example, a signal is generated when the detected variation in mass measurement is less than a certain threshold value. The threshold value of variation in mass measurement is, for example, an expected minimum variation in mass measurement of the relative position of the laser and the target droplet that can be adequately distinguished from the plasma flash. In some embodiments, the expected minimum variation in mass measurement of the relative position of the laser and the target droplets is determined based on an average variation in mass measurement. In some embodiments, the expected minimum variation in mass measurement is, for example, one standard deviation or two standard deviations less than the average variation in mass measurement determined for the largest distance.

If the variation in mass measurement of the deposited particle mass is not within the acceptable range, at S 1040, the configurable parameter of the EUV apparatus is automatically adjusted to increase or decrease the variation in mass measurement of the target droplet so as to ultimately bring the variation in mass measurement of the detected light within the acceptable range.

In various embodiments, the configurable parameter of the EUV apparatus includes, for example, an input voltage and/or current to the light source (e.g., laser) in the excitation laser, a time delay of the excitation laser, and a value of the angle and/or tilt of the excitation laser. In some embodiments, the configurable parameter is adjusted using a controller that is programmed to control various configurable parameters of the excitation laser. For example, in an embodiment, the controller is coupled to a time delay controller for controlling the time between the pre-pulse and the main-pulse and/or a mechanism that controls the tilt/angle of the optical element for the excitation lasers PP and MP. In such embodiments, the controller is coupled to the mass detector 1100 and adjusts the length of the time delay and/or the tilt of the optical element for the excitation lasers PP and MP in response to the signal generated by the mass detector 1100 when the variation in mass measurement of the detected light is not within the acceptable range.

In some embodiments, the controller includes a logic circuit programmed to receive a signal from the mass detector 1100, and depending on the received signal, transmit control signals to one or more components of the excitation laser to automatically adjust one or more configurable parameters of the excitation laser.

Figure 7:
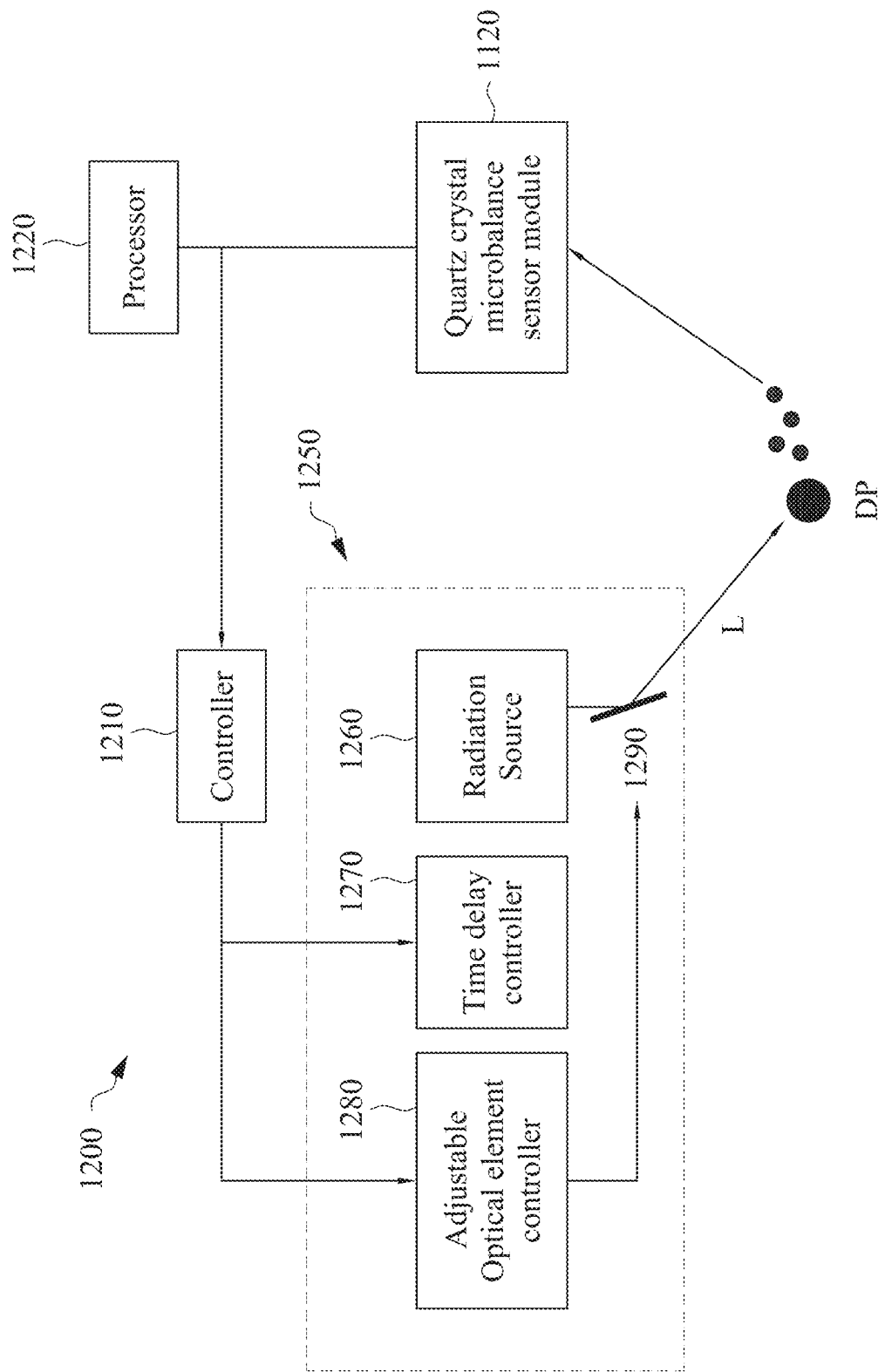
FIG. 7 schematically illustrates an apparatus for performing a mass measurement of a target droplet in the EUV radiation source in accordance with an embodiment of the present disclosure.

FIG. 7 schematically illustrates an apparatus for performing a mass measurement of a target droplet in an EUV source in accordance with an embodiment of the present disclosure. In an embodiment, the apparatus includes an excitation laser assembly 1250, a quartz crystal microbalance sensor module 1120, a controller 1210 and a processor 1220.

In various embodiments, the excitation laser assembly 1250 includes a radiation source 1260 configured to provide a pre-pulse PP and a main-pulse MP, a time delay controller 1270 and an adjustable optical element controller 1280. The adjustable optical element controller 1280 controls the tilt angle of an optical element 1290. In various embodiments, the adjustable optical element controller 1280 is an actuator coupled to the optical element of the excitation laser assembly 1250 and moves the optical element 1290 to change the angle of incidence at which light (or radiation) L is incident on the target droplet DP, thereby changing the amount of light R reflected and/or scattered by the target droplet DP into the quartz crystal microbalance sensor module 1120. In some embodiments, the adjustable optical element controller 1280 includes a piezoelectric actuator.

The time delay controller 1270 controls the time delay between the pre-pulse PP and the main-pulse MP. For example, when the controller 1210 determines that the variation in mass measurement at the quartz crystal microbalance sensor module 1120 is greater than the acceptable range, the controller 1210 controls the time delay controller 1270 such that a shorter time delay is provided between the pre-pulse PP and the main-pulse MP, thereby allowing adequate exposure of the target droplet DP and increasing the detected variation in mass measurement. In such embodiments, one configurable parameter of the EUV apparatus adjusted by the controller 1210 is the time delay in the path of light L exposing the target droplet.

Those of skill in the art will note that while the adjustable optical element controller 1280 and auto time delay 1270 are depicted in the FIG. 7 as being separate from the radiation source 1260, the adjustable optical element controller 1280 and the auto time delay 1270 can be integrated with the radiation source 1260 to form a single excitation laser assembly 1250 in some embodiments. In such embodiments, the coupling between the controller 1210 and the excitation laser assembly 1250 is suitably modified to effectuate the same result as disclosed herein.

The controller 1210, thus, sets the variation in mass measurement at the quartz crystal microbalance sensor module 1120 to enable a stable exposure of target droplets over a duration of time. A time difference between the exposure of a given target droplet and the detection of peak EUV produced by the immediately preceding target droplet provides, as discussed elsewhere herein, the mass measurement in x and y axis at which the target droplets traverse between the position P and the zone of excitation ZE. An accurate measurement of the reflected or scattered light of the plasma is important for stable production of EUV radiation because it allows synchronization between the arrival of the target droplet and the excitation pulse at the zone of excitation.

In the present disclosure, by automatically optimizing the droplet illumination/detection modules, the mass measurement of debris is improved and synchronization between excitation pulses and the target droplets is improved. Thus, it is possible to improve the efficiency and stability of an LPP based EUV source.

It will be understood that not all advantages have been necessarily discussed herein, no particular advantage is required for all embodiments or examples, and other embodiments or examples may offer different advantages.

According to one aspect of the present disclosure, a lithography apparatus comprises an extreme ultraviolet (EUV) scanner, an EUV source coupled to the EUV scanner, and a quartz crystal microbalance. The quartz crystal microbalance is disposed on an internal surface of at least one of the EUV source and the EUV scanner. In some embodiments, the quartz crystal microbalance is configured to measure a variation in frequency of a quartz crystal resonator in response to variation of mass due to debris particles at an interface between the EUV source and the EUV scanner. In some embodiments, the apparatus further comprises a feedback controller. In some embodiments, the feedback controller is coupled to the quartz crystal microbalance and one or more of the droplet generator, the excitation laser source, and an adjustable optical element controlling the trajectory of the excitation laser source associated with the EUV source. In some embodiments, the feedback controller is configured to adjust one or more parameters of the droplet generator, the excitation laser source, and the adjustable optical element based on the variation in output of the quartz crystal microbalance generated by the debris particles. In some embodiments, the feedback controller is configured to determine whether a variation in mass measurement of debris is within an acceptable range. In some embodiments, the feedback controller automatically adjusts a configurable parameter of the EUV source in response to the variation in mass measurement that is not within the acceptable range. In some embodiments, the feedback controller automatically sends a notification based on a mass measurement information when a rate of deposition on the quartz crystal microbalance is greater than a threshold.

According to another aspect of the present disclosure, a lithography apparatus comprises an extreme ultraviolet (EUV) scanner, an EUV source coupled to the EUV scanner, a quartz crystal microbalance, and a feedback controller. The quartz crystal microbalance is disposed on an internal surface of at least one of the EUV source and the EUV scanner. The feedback controller is coupled to the quartz crystal microbalance and one or more of a radiation source, a droplet generator, and optical guide elements controlling the trajectory of the radiation source associated with the EUV source. The feedback controller is configured to adjust one or more parameters of a radiation source, the droplet generator, and/or the optical guide elements controlling the trajectory of the radiation source in response to a measurement result of the quartz crystal microbalance. In some embodiments, the radiation source is configured to adjust a time delay between a pre-pulse and a main pulse at a predetermined position. In some embodiments, the radiation source is configured to adjust a spatial separation between the pre-pulse and the main-pulse. In some embodiments, the actuator is a piezoelectric actuator. In some embodiments, the apparatus further comprises an actuator that is configured to control a focal point of one of or both the pre-pulse and the main pulse. In some embodiments, the feedback controller is configured to control the actuator to change the focal point of one of or both the pre-pulse and main pulse based on a variation in variation in frequency of a quartz crystal resonator in response to variation of mass due to debris particles. In some embodiments, the optical guide elements are adjustable in 3 axis. In some embodiments, the actuator is a piezoelectric actuator.

According to yet another aspect of the present disclosure, a method of controlling a feedback control system of an extreme ultraviolet (EUV) radiation source includes measuring a configurable parameter of the EUV radiation source. The method also performs a mass measurement of debris by a mass detector when the target droplets are converted to plasma. The method also determines whether a variation in mass measurement is within an acceptable range. In response to the variation in the mass measurement that is not within the acceptable range, the method automatically adjusts the configurable parameter of the EUV radiation source to set the variation in mass measurement of debris is within the acceptable range. In some embodiments, the method further includes generating, by the feedback control system, a notification based on a new mass measurement information. The new mass measurement information indicates that the mass measurement is within the acceptable mass measurement range. In some embodiments, the notification includes a spatial separation between the pre-pulse and the main-pulse. In some embodiments, the notification also includes a time delay between the pre-pulse and the main-pulse. In some embodiments, the notification also includes an angle of an adjustable optical element coupled to the radiation source. In some embodiments, the method further sends the notification to a first external device associated with an adjustable optical element controller and a second external device associated with a time delay controller based on the generating the notification.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography apparatus, comprising:
   an extreme ultraviolet (EUV) scanner in a chamber;
   an EUV source coupled to the EUV scanner in the chamber;
   a quartz crystal microbalance disposed on an internal surface, adjacent to and inside of an interface between the EUV source and the EUV scanner inside the chamber, of at least one of the EUV source and the EUV scanner; and
   a feedback controller,
   wherein the feedback controller is configured to adjust a focus of a pre-pulse and a main pulse caused by at least one of mechanical or electrical drift of the EUV source by using a measurement result by the quartz crystal microbalance.

2. The lithography apparatus of claim 1, wherein the quartz crystal microbalance is configured to measure a variation in frequency of a quartz crystal resonator in response to variation of mass due to debris particles at the interface between the EUV source and the EUV scanner.

3. The lithography apparatus of claim 1, wherein the feedback controller is coupled to the quartz crystal microbalance and one or more of a droplet generator, an excitation laser source, and an adjustable optical element controlling a trajectory of the excitation laser source associated with the EUV source.

4. The lithography apparatus of claim 3, wherein the feedback controller is configured to adjust one or more parameters of the droplet generator, the excitation laser source, and the adjustable optical element based on a variation in output of the quartz crystal microbalance generated by debris particles.

5. The lithography apparatus of claim 3, wherein the feedback controller is configured to determine whether a variation in mass measurement of debris is within an acceptable range.

6. The lithography apparatus of claim 3, wherein the feedback controller, in response to a variation in mass measurement that is not within the acceptable range, automatically adjusts a configurable parameter of the EUV source.

7. The lithography apparatus of claim 3, wherein the feedback controller automatically sends a notification based on a mass measurement information when a rate of deposition on the quartz crystal microbalance is greater than a threshold.

8. A lithography apparatus, comprising:
an extreme ultraviolet (EUV) scanner in a chamber;
an EUV source coupled to the EUV scanner in the chamber;
a quartz crystal microbalance disposed on an internal surface, adjacent to and inside of an interface between the EUV source and the EUV scanner inside the chamber, of at least one of the EUV source and the EUV scanner; and
a feedback controller coupled to the quartz crystal microbalance and one or more of a radiation source, a droplet generator, and optical guide elements controlling a trajectory of the radiation source associated with the EUV source,
wherein the feedback controller is configured to adjust one or more parameters of a radiation source, the droplet generator, and/or the optical guide elements controlling the trajectory of the radiation source in response to a measurement result of the quartz crystal microbalance, and
wherein the feedback controller is configured to adjust a focus of a pre-pulse and a main pulse caused by at least one of mechanical and electrical drift of the EUV source by using a measurement result by the quartz crystal microbalance.

9. The lithography apparatus of claim 8, wherein the feedback controller is configured to adjust a time delay between the pre-pulse and the main pulse at a predetermined position.

10. The lithography apparatus of claim 8, wherein the feedback controller is configured to adjust a spatial separation between the pre-pulse and the main pulse.

11. The lithography apparatus of claim 8, further comprising an actuator,
wherein the feedback controller is, configured to control the actuator to adjust a focal point of one of or both the pre-pulse and the main pulse.

12. The lithography apparatus of claim 11, wherein the feedback controller is configured to control the actuator to change the focal point of one of or both the pre-pulse and the main pulse based on a variation in variation in frequency of a quartz crystal resonator in response to variation of mass due to debris particles.

13. The lithography apparatus of claim 8, wherein the optical guide elements are adjustable in 3 axis.

14. The lithography apparatus of claim 11, wherein the focus of the pre-pulse and the main pulse is adjusted by adjusting a plurality of optical elements.

15. A lithography apparatus, comprising:
an EUV radiation source in a chamber of which a configurable parameter is measured;
a mass detector configured to perform a mass measurement of debris when target droplets are converted to plasma, the mass detector positioned adjacent to and inside of an interface between the EUV radiation source and an EUV scanner inside the chamber; and
a controller,
wherein the controller is configured to determine whether a variation in mass measurement of the debris is within an acceptable range,
in response to a variation in mass measurement that is not within the acceptable range of variation in mass measurement, the controller automatically adjust one or more of configurable parameters of the EUV radiation source to set the variation in mass measurement of the debris within the acceptable range, and
wherein the controller is configured to adjust a focus of a pre-pulse and a main pulse caused by at least one of mechanical and electrical drift of the EUV source by using a measurement result by the mass detector.

16. The lithography apparatus according to claim 15, the controller further generates a notification based on a new mass measurement information indicating the mass measurement is within the acceptable mass measurement range.

17. The lithography apparatus according to claim 16, wherein the notification includes a spatial separation between the pre-pulse and the main pulse.

18. The lithography apparatus according to claim 16, wherein the notification includes a time delay between the pre-pulse and the main pulse.

19. The lithography apparatus according to claim 16, wherein the notification includes an angle of an adjustable optical element coupled to the radiation source.

20. The lithography apparatus of claim 16, based on the generating the notification, the controller further sends the notification to a first external device associated with an adjustable optical element controller and a second external device associated with a time delay controller.

* * * * *